United States Patent
Okamoto et al.

(10) Patent No.: US 10,662,278 B2
(45) Date of Patent: May 26, 2020

(54) COMPOSITION FOR OPTICAL STEREOLITHOGRAPHY AND METHOD FOR PRODUCING STEREOLITHOGRAPHIC OBJECT USING THE SAME

(71) Applicant: Okamoto Chemical Industry Co., Ltd., Saitama (JP)

(72) Inventors: Hiroaki Okamoto, Saitama (JP); Masaro Nakatsuka, Saitama (JP)

(73) Assignee: OKAMOTO CHEMICAL INDUSTRY CO., LTD., Saitama (JP)

( * ) Notice: Subject to any disclaimer, the term of this patent is extended or adjusted under 35 U.S.C. 154(b) by 0 days.

(21) Appl. No.: 15/564,474

(22) PCT Filed: Mar. 30, 2016

(86) PCT No.: PCT/JP2016/060403
§ 371 (c)(1),
(2) Date: Oct. 5, 2017

(87) PCT Pub. No.: WO2016/163283
PCT Pub. Date: Oct. 13, 2016

(65) Prior Publication Data
US 2018/0072841 A1    Mar. 15, 2018

(30) Foreign Application Priority Data

Apr. 6, 2015 (JP) ................................ 2015-077645
Nov. 25, 2015 (JP) ................................ 2015-229597

(51) Int. Cl.

| | | |
|---|---|---|
| C08G 59/24 | (2006.01) | |
| B29C 67/00 | (2017.01) | |
| C08L 33/00 | (2006.01) | |
| B33Y 10/00 | (2015.01) | |
| C08G 59/20 | (2006.01) | |
| B33Y 80/00 | (2015.01) | |
| B33Y 70/00 | (2020.01) | |
| C08L 63/00 | (2006.01) | |
| G02B 1/04 | (2006.01) | |
| B29C 64/135 | (2017.01) | |
| C08F 2/50 | (2006.01) | |
| C08F 122/10 | (2006.01) | |
| C08G 59/38 | (2006.01) | |
| C08G 65/18 | (2006.01) | |
| G03F 7/00 | (2006.01) | |
| G03F 7/004 | (2006.01) | |
| G03F 7/038 | (2006.01) | |

(52) U.S. Cl.
CPC .......... *C08G 59/245* (2013.01); *B29C 64/135* (2017.08); *B29C 67/00* (2013.01); *B33Y 10/00* (2014.12); *B33Y 70/00* (2014.12); *B33Y 80/00* (2014.12); *C08F 2/50* (2013.01); *C08F 122/105* (2013.01); *C08G 59/20* (2013.01); *C08G 59/38* (2013.01); *C08G 65/18* (2013.01); *C08L 33/00* (2013.01); *C08L 63/00* (2013.01); *G02B 1/04* (2013.01); *G03F 7/0037* (2013.01); *G03F 7/0045* (2013.01); *G03F 7/0046* (2013.01); *G03F 7/038* (2013.01)

(58) Field of Classification Search
CPC ...... C08G 59/245; C08G 59/20; C08G 59/38; C08G 65/18; C08F 2/50; C08F 122/105; C08L 33/00; C08L 63/00; G02B 1/04; G03F 7/0037; G03F 7/0045; G03F 7/0046; G03F 7/038; B33Y 10/00; B33Y 70/00; B33Y 80/00; B29C 64/135; B29C 67/00
See application file for complete search history.

(56) References Cited

U.S. PATENT DOCUMENTS

| | | | | |
|---|---|---|---|---|
| 6,342,295 B1 * | 1/2002 | Kobayashi | ........... | G01N 27/121 338/35 |
| 2015/0158971 A1 | 6/2015 | Ogane et al. | | |
| 2015/0232654 A1 | 8/2015 | Sugihara et al. | | |

FOREIGN PATENT DOCUMENTS

| | | | | |
|---|---|---|---|---|
| EP | 2851386 A1 | 3/2015 | | |
| EP | 2902416 A1 | 8/2015 | | |
| JP | 5821411 | 2/1983 | | |
| JP | H11-228804 | 8/1999 | | |
| JP | 2007-284550 | 11/2007 | | |
| JP | 2007284550 | * 11/2007 | ............. | C08G 59/24 |
| JP | 2008-260812 | 10/2008 | | |
| JP | 5210645 | 8/2009 | | |
| JP | 2013-023574 | 2/2013 | | |

(Continued)

OTHER PUBLICATIONS

CVC catalog (Jun. 2006).*

(Continued)

*Primary Examiner* — Shane Fang
(74) *Attorney, Agent, or Firm* — Alston & Bird LLP

(57) ABSTRACT

Provided is a water-soluble composition for optical three-dimensional modeling having little burden on the environment, which enables the production of a three-dimensional model that has both little warping deformation and excellent mechanical characteristics, while exhibiting good adhesion between cured film layers during the production process of the three-dimensional model; and a method for producing a three-dimensional model, which uses this composition for optical three-dimensional modeling. Specifically provided is a water-soluble composition for optical three-dimensional modeling, which contains (A) 10-70% by mass of a water-soluble cationically polymerizable compound that is an ether derivative compound of a sorbitol having a glycidyl ether structure, (B) 1-30% by mass of a water-soluble radically polymerizable compound having a methacryl group and/or an acryl group, (C) 0.1-20% by mass of an antimony-free cationic polymerization initiator that is a sulfonium compound or a bis(alkylphenyl)iodonium compound, and (D) 0.1-20% by mass of a radical polymerization initiator.

10 Claims, No Drawings

(56) References Cited

FOREIGN PATENT DOCUMENTS

| JP | 2013-114184 | 6/2013 |
| JP | 2014-001215 | 1/2014 |
| WO | WO-2013/172407 | 11/2013 |
| WO | WO-2014/051046 | 4/2014 |
| WO | WO-2015/080159 | 6/2015 |

OTHER PUBLICATIONS

Denacol catalog (2018).*

Extended European Search Report for corresponding European Application No. 16776450.5 dated Oct. 11, 2018, 5 pages.

"3,4-Epoxycyclohexylmethyl 3',4'-Epoxycyclohexanecarboxylate." Safety Data Sheet. Wako Pure Chemical Industries, Ltd.; Osaka, Japan; Jun. 13, 2016; 6 pages.

"Dodecyl Acrylate." Safety Data Sheet. Wako Pure Chemical Industries, Ltd.; Osaka, Japan; Jul. 4, 2016; 6 pages.

"Epoxyester 3000A." Safety Data Sheet. Kyoeisha Chemical Co. Ltd.; Osaka, Japan; Jun. 19, 2015, 6 pages.

"HDGE." Safety Data Sheet. Sachem Europe BV; Zaltbommel, The Netherlands; Dec. 17, 2010, 9 pages.

"NK ESTER A-9550." Material Safety Data Sheet; Shin-Nakamura Chemical Co., Ltd.; Wakayama City, Japan; Jan. 28, 2009; 4 pages.

"NK ESTER A-DCP." Material Safety Data Sheet. Shin-Nakamura Chemical Co., Ltd.; Wakayama City, Japan; Jun. 30, 2016; 4 pages.

"Rikaresin DME-100." Safety Data Sheet No. 6138020; New Japan Chemical Co., Ltd.; Kyoto, Japan; Nov. 12, 2010; 9 pages.

"SR399." Safety Data Sheet. Arkema Inc.; King of Prussia, Pennsylvania; Jul. 8, 2014; 10 pages.

"SR494." Safety Data Sheet. Arkema Inc.; King of Prussia, Pennsylvania; Jul. 8, 2014; 10 pages.

International Search Report and Written Opinion of the International Search Authority for PCT Application No. PCT/JP2016/060403, dated Jun. 7, 2016, with English translation of the Search Report, 12 pages.

* cited by examiner

US 10,662,278 B2

COMPOSITION FOR OPTICAL STEREOLITHOGRAPHY AND METHOD FOR PRODUCING STEREOLITHOGRAPHIC OBJECT USING THE SAME

TECHNICAL FIELD

The present invention relates to a composition for optical stereolithography and a method for producing a stereolithographic object using the composition.

BACKGROUND ART

Recently, an optical stereolithographic technique has attracted attention for fabricating a stereolithographic object based on three-dimensional CAD data by forming and stacking cured layers one by one by curing a photo-curable resin through ultraviolet laser scanning. Since the optical stereolithographic technique (hereinafter, the term "optical stereolithography" will also be referred to as "stereolithography") enables easy and quick fabrication of prototypes without preparing a die or a mold, it is possible to reduce the time and cost required for a product development from the design to the production. Along with the rapid spread of three-dimensional CAD, the stereolithographic technique has been adopted in a wide variety of industrial fields such as automobile parts, electrical equipment, medical equipment, and so forth.

As the fields to the optical stereolithographic technique is applied are expanding, the performances demanded for the photo-curable resins are also increasing. Particularly, demanded are photo-curable resins having high curing rates and being capable of forming stereolithographic objects which are excellent in dimensional stability and dimensional precision when cured and tend not to be fractured even when an external stress such as bending is applied thereto, and which have excellent heat resistance and mechanical properties such as toughness and durability.

Moreover, from the viewpoints of environmental problems and safety, a technique which reduces the environmental burden and enhances the safety is demanded for the stereolithographic technique, for example, the process of producing a stereolithographic object and a photo-curable resin for use to form a stereolithographic object. For example, antimony compounds used as cationic polymerization initiators are generally toxic and exhibit toxic actions similar to those of arsenic and mercury, and have a great influence on the working environment in some cases. For this reason, there has been proposed a composition for stereolithography which contains no harmful components such as antimony compounds, so that the composition is excellent in safety and does not cause environmental contamination (for example, Patent Document 1).

In conventional compositions for stereolithography, an oil-soluble cationic polymerizable compound and an oil-soluble radical polymerizable compound are commonly adopted. Thus, the compositions for stereolithography exhibit such properties as being oil soluble. An organic solvent such as acetone or isopropyl alcohol needs to be used to wash a stereolithographic object produced by using such an oil-soluble composition for stereolithography and a stereolithography apparatus used for the production. The use of an organic solvent such as acetone or isopropyl alcohol is undesirable because it increases the burden to the environment, contaminates the working environment, and may adversely affect the health and safety of the workers. Hence, a water-soluble composition for stereolithography has been developed which contains a water-soluble radical polymerizable compound and an ionic surfactant (for example, Patent Document 2).

In addition, along with the progress of the stereolithographic technique, there are demands for photo-curable resins which are applicable to usages requiring higher heat resistance such as, for example, a stereolithographic object used as an engine part, and the like. For example, there have been proposed compositions containing a particular cationic polymerizable organic substance and a particular compound having two oxetanyl groups (for example, Patent Documents 3, 4, 5).

PRIOR ART DOCUMENT

Patent Documents

[Patent Document 1] Japanese Patent No. 5210645
[Patent Document 2] International Publication No. WO2014/051046
[Patent Document 3] Japanese Patent Application Publication No. Hei 11-228804
[Patent Document 4] Japanese Patent Application Publication No. 2008-260812
[Patent Document 5] Japanese Patent Application Publication No. 2013-023574

SUMMARY OF INVENTION

Technical Problems

In this respect, in an event of producing a stereolithographic object, generally, a number of thin cured film layers having a thickness of approximately around 20 to 100 microns are formed by scanning a composition for stereolithography with an ultraviolet laser and stacked on one another to produce the stereolithographic object. In this event, the strength of the stereolithographic object is adversely affected unless the thin cured film layers adhere to one another. Further, conventional compositions for stereolithography have problems that the stereolithographic objects are warped and caught in the ultraviolet-laser scanning machine during the production in some cases.

Moreover, a common practice to enhance the heat resistance of a stereolithographic object is to further heat the composition at, for example, 60 to 250° C., after curing by light irradiation (Patent Document 3). However, such a heat treatment decreases the work efficiency due to an increase in the number of steps, and may serve as one cause of environmental burden (for example, global warming).

An object of the present invention is to provide: a water-soluble composition for optical stereolithography, the composition being soluble in water, more environmentally friendly, capable of completing stereolithography (photo curing) within a shorter time, and excellent in mechanical properties, toughness, and heat resistance without a heat treatment operation (heating at 60° C. or higher); and a method for producing a stereolithographic object using the composition.

Solution to Problems

Specifically, one embodiment of the present invention makes it possible to provide a water-soluble composition for optical stereolithography, containing:

10 to 70% by mass of (A) a water-soluble cationic polymerizable compound which is an ether derivative of sorbitol having a glycidyl ether structure;

1 to 30% by mass of (B) a water-soluble radical polymerizable compound having a methacrylic group and/or an acrylic group;

0.1 to 20% by mass of (C) an antimony-free cationic polymerization initiator which is a sulfonium compound or a bis(alkylphenyl)iodonium compound; and 0.1 to 20% by mass of (D) a radical polymerization initiator.

Another aspect of the present invention makes it possible to provide a water-soluble composition for optical stereolithography containing:

(A) a water-soluble cationic polymerizable compound which is an ether derivative of sorbitol having a glycidyl ether structure;

(B) a water-soluble radical polymerizable compound having a methacrylic group and/or an acrylic group;

(C) an antimony-free cationic polymerization initiator which is a sulfonium compound or a bis(alkylphenyl)iodonium compound;

(D) a radical polymerization initiator;

(E) a novolac-type epoxy resin which is a cationic polymerizable compound; and (F) a sensitizer, the composition containing:

10 to 70% by mass of (A) the water-soluble cationic polymerizable compound, 1 to 30% by mass of (B) the water-soluble radical polymerizable compound, 0.1 to 20% by mass of (C) the antimony-free cationic polymerization initiator, 0.1 to 20% by mass of (D) the radical polymerization initiator, 1 to 30% by mass of (E) the novolac-type epoxy resin, and 0.05 to 5.0% by mass of (F) the sensitizer.

Another aspect of the present invention makes it possible to provide a method for producing a stereolithographic object, including a step of curing the composition for optical stereolithography by irradiation with an activation energy ray.

Another aspect of the present invention makes it possible to provide a stereolithographic object containing a cured product of the composition for optical stereolithography.

Advantageous Effects of Invention

The present invention makes it possible to obtain a water-soluble composition for optical stereolithography which is highly safe and imposes less environmental burden. When a stereolithographic object is produced from this composition, the photo curing time can be shortened, and a stereolithographic object excellent in toughness and heat resistance can be obtained. Specifically, it is possible to preferably enhance the toughness and heat resistance without heating at 60° C. or higher. Further, the present invention enables cured film layers to adhere to one another in a process of producing a stereolithographic object, producing a stereolithographic object having a small warp deformation and excellent mechanical properties.

DESCRIPTION OF EMBODIMENTS

Hereinafter, embodiments of the present invention will be described in detail. However, the scope of the present invention is not limited to these embodiments.

According to one embodiment, the present invention relates to a composition for optical stereolithography. The composition for optical stereolithography according to the present invention contains at least components (A) to (D), and contains, as necessary, components (E) and (F), and also other components.

The component (A) is a water-soluble cationic polymerizable compound which is an ether derivative of sorbitol having a glycidyl ether structure. Incorporating the component (A) brings about an effect of easily dissolving the composition for optical stereolithography in water. It is only necessary that the component (A) in an uncured state should be water soluble and thus can be washed down with water at normal temperature. For example, the solubility into water at normal temperature (25° C.) is 5 g/100 ml, preferably 40 g/100 ml or more, and more preferably 50 g/100 ml or more. In the ether derivative of sorbitol having a glycidyl ether structure of the component (A), the sorbitol may be in any one of the D-form and the L-form, or the sorbitol may be a mixture of the D-form and the L-form.

In the ether derivative of sorbitol having a glycidyl ether structure of the component (A), at least one hydrogen atom of six hydroxy groups of sorbitol represented by the following formula (I):

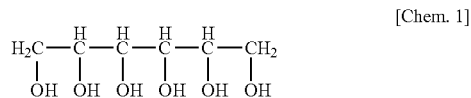

[Chem. 1]

is substituted with the following glycidyl group:

[Chem. 2]

Alternatively, in the ether derivative of sorbitol having a glycidyl ether structure of the component (A), at least one hydrogen atom of six hydroxy groups of the sorbitol may be substituted with the following glycidyl polyoxyethylene group:

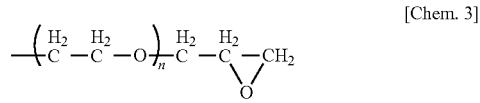

[Chem. 3]

(in the formula, n independently represents an integer of 1 to 50). Alternatively, in the ether derivative of sorbitol having a glycidyl ether structure of the component (A), at least one hydrogen atom of six hydroxy groups of the sorbitol may be substituted with a glycidyl group, while at least one hydrogen atom of the other hydroxy groups of the sorbitol may be further substituted with a glycidyl polyoxyethylene group. The ether derivative of sorbitol having a glycidyl ether structure of the component (A) further substituted with the glycidyl polyoxyethylene group will also be referred to as "glycidyl ether of polyoxyethylene ether of sorbitol." When the ether derivative of sorbitol having a glycidyl ether structure of the component (A) further has a glycidyl polyoxyethylene group, many glycidyl groups are introduced, so that the component (A) is easily dissolved in water even if the hydroxy group content is low.

The cationic polymerizable compound of the component (A) has an epoxy equivalent of preferably 155 to 200 g/eq, more preferably 160 to 180 g/eq, and further preferably 165 to 175 g/eq. Here, an epoxy equivalent refers to the number of grams of a resin containing 1 gram equivalent of an epoxy group, which is measured by the method in accordance with JIS K 7236. The cationic polymerizable compound of the component (A) is preferably liquid at normal temperature.

The water soluble cationic polymerizable compound of the component (A) can be synthesized with reference to known methods (for example, Japanese Patent Application Publication No. 2001-39960; Jikken Kagaku Kouza (the 4th Series of Experimental Chemistry) 28, P. 428). Besides, commercially available products can also be used. For example, specific examples of the commercially available products include sorbitol polyglycidyl ether products manufactured by Nagase ChemteX Corporation such as Denacol EX-611 (epoxy equivalent: 167 g/eq), Denacol EX-612 (epoxy equivalent: 166 g/eq), Denacol EX-614 (epoxy equivalent: 167 g/eq), and Denacol EX-614B (epoxy equivalent: 173 g/eq); and ERISYS GE-60 (epoxy equivalent: 160 to 195 g/eq) manufactured by Emerald Performance Materials.

The content of the cationic polymerizable compound of the component (A) is 10 to 70% by mass, preferably 20 to 60% by mass, and more preferably 30 to 50% by mass, in a total amount of the composition for optical stereolithography. If the content of the cationic polymerizable compound of the component (A) is less than 10% by mass, the composition for optical stereolithography has an insufficient water solubility. If the content exceeds 70% by mass, the cured thin film layers weakly adhere to one another. The cured thin film layers favorably adhering to one another improve the warp deformation when a stereolithographic object is fabricated, making it possible to enhance mechanical properties such as tensile strength, elongation, bending strength, and bending modulus of the obtained stereolithographic object.

The composition for optical stereolithography may further contain another cationic polymerizable compound in addition to the cationic polymerizable compound of the component (A). The another cationic polymerizable compound is preferably a multifunctional monomer having two or more cationic polymerizable bonds in one molecule. The another cationic polymerizable compound is, for example, a cationic polymerizable compound having an epoxy group, a vinyl ether group, or an oxetane group, preferably a cationic polymerizable compound having one or more epoxy groups. This cationic polymerizable compound having an epoxy group(s) is other than the ether derivative of sorbitol having a glycidyl ether structure of the component (A).

Specific examples of the cationic polymerizable compound having an epoxy group include polyglycerol polyglycidyl ether, glycerol polyglycidyl ether, diethylene glycol diglycidyl ether, polyethylene glycol #200 diglycidyl ether, polyethylene glycol #400 diglycidyl ether, and other polyethylene glycol diglycidyl ethers; 3,4-epoxycyclohexylmethyl 3,4-epoxycyclohexanecarboxylate, ε-caprolactone-modified 3,4-epoxycyclohexylmethyl 3,4-epoxycyclohexanecarboxylate, ethylene glycol diglycidyl ether, propylene glycol diglycidyl ether, tripropylene glycol diglycidyl ether, polypropylene glycol #400 diglycidyl ether, and other polypropylene glycol diglycidyl ethers; polytetramethylene glycol diglycidyl ether, neopentyl glycol diglycidyl, 1,6-hexanediol diglycidyl ether, hydrogenated bisphenol A diglycidyl ether, hexahydrophtalic acid diglycidyl ester, diglycerol polyglycidyl ether, trimethylolpropane polyglycidyl ether, bisphenol A-PO 2 mol added diglycidyl ether, and other bisphenol A diglycidyl ethers; bisphenol A epoxy resin (liquid), bisphenol F epoxy resin (liquid), phenol novolac-type epoxy resin (liquid), 4-(2,3-epoxypropan-1-yloxy)-N,N-bis(2,3-epoxypropan-1-yl)-2-methylaniline, glycidyl methacrylate, alkyl phenol monoglycidyl ether, 4,4-methylenebis[N,N-bis(oxiranylmethyl) aniline], flexible and tough liquid epoxy resin EXA-4850-150 (manufactured by DIC Corporation), and the like.

Specific examples of the cationic polymerizable compound having a vinyl ether group include cyclopentadiene vinyl ether, tricyclodecane vinyl ether, benzyl vinyl ether, 1,4-butanediol divinyl ether, cyclohexane dimethanol divinyl ether, diethylene glycol divinyl ether, triethylene glycol divinyl ether, oxetane divinyl ether, 4-cyclohexane divinyl ether, oxanorbornane divinyl ether, and the like.

Specific examples of the cationic polymerizable compound having an oxetane group include (3-ethyl-oxetane-3-yl)-methanol, 3-(3-ethyl-oxetane-3-ylmethoxy)-propan-1-ol, 4-(3-ethyl-oxetane-3-ylmethoxy)-butan-1-ol, 3-(3-ethyl-oxetane-3-ylmethoxy)-propane-1,2-diol, 1-(3-ethyl-oxetane-3-ylmethoxy)-propan-2-ol, 1-[2-(3-ethyl-oxetane-3-ylmethoxy)-1-methyl-ethoxy]-ethanol, 2-[2-(3-ethyl-oxetane-3-ylmethoxy)-ethoxy]-ethanol xylylene bisoxetane, 3-ethyl-3[[(3-ethyloxetane-3-yl)methoxy]methyl]oxetane, 2-ethylhexyloxetane, 1,4-benzenedicarboxylic acid bis[(3-ethyl-3-oxetanyl)methyl]ester, (3-ethyl-3-oxetanyl) methoxymethyl methacrylate, 4,4-bis(3-ethyl-3-oxetanyl) methoxymethyl)biphenyl, 3-ethyl-3-(vinyloxymethyl) oxetane, and the like.

One of the cationic polymerizable compounds having an epoxy group, a vinyl ether group, or an oxetane group can be used alone, or two or more thereof can be used in combination.

As the cationic polymerizable compounds having an epoxy group, a vinyl ether group, or an oxetane group, commercially available products can be used. Examples thereof include Crossmer manufactured by Nippon Carbide Industries Co., Inc., Celloxides and Epoleads manufactured by Daicel Corporation, Denacol series manufactured by Nagase ChemteX Corporation, vinyl ethers manufactured by Maruzen Petrochemical Co., Ltd., Sumi-Epoxy manufactured by Sumitomo Chemical Co., Ltd., polyepoxies manufactured by Sakamoto Yakuhin Kogyo Co., Ltd., Epolights manufactured by Kyoeisha Chemical Co., Ltd., YD series, YDF series, ST series, and YH-300 series manufactured by Nippon Steel & Sumikin Chemical Co., Ltd., Basic Liquid Type, Bis-F Liquid Type, Multifunction liquid Type, Flexible Liquid Type, and Special Function Liquid Type manufactured by Mitsubishi Chemical Corporation, and the like.

The content of the cationic polymerizable compounds having an epoxy group, a vinyl ether group, or an oxetane group, which may be further incorporated in addition to the cationic polymerizable compound of the component (A), is preferably lower than the content of the cationic polymerizable compound of the component (A), and is preferably 1 to 30% by mass, and more preferably 1 to 20% by mass, in the total amount of the composition for optical stereolithography. Incorporating the cationic polymerizable compounds having an epoxy group, a vinyl ether group, or an oxetane group within the range of 1 to 30% by mass makes it possible to adjust properties of the cured product such as tensile strength, warp deformation, and bending strength. Moreover, the cationic polymerizable compound having an oxetane group has an effect of enhancing the curing rate of the cationic polymerizable compound. This speeds up the production of the stereolithographic object using the composition for optical stereolithography, enabling the production at a high stereolithographic speed with a high productivity.

Among the cationic polymerizable compounds having an epoxy group, a vinyl ether group, or an oxetane group, which may be further incorporated in addition to the cationic polymerizable compound of the component (A), preferable is a novolac-type epoxy resin (component (E)). The novolac-type epoxy resin of the component (E) which is a cationic polymerizable compound is preferably oil soluble and non-ionic. The novolac-type epoxy resin of the component (E) which is a cationic polymerizable compound is, for example, a multifunctional epoxy resin obtained by epoxidation on a hydroxy group of a novolac, and the heat resistance is commonly excellent. The novolac-type epoxy resin is preferably liquid at normal temperature. The novolac-type epoxy resin may be, for example, a liquid phenol novolac-type epoxy resin. The novolac-type epoxy resin has an epoxy equivalent of preferably 170 to 190 g/eq. Commercially available novolac-type epoxy resins may be used. Specific examples of the novolac-type epoxy resins include EPICLON N-730A (epoxy equivalent: 172 to 179 g/eq) and EPICLON N-770 (epoxy equivalent: 183 to 187 g/eq) manufactured by DIC Corporation, JER152 (epoxy equivalent: 176 to 178 g/eq) and JER154 (epoxy equivalent: 176 to 180 g/eq) manufactured by Mitsubishi Chemical Corporation, YDPN-638 (epoxy equivalent: 175 to 176 g/eq), YDCN-700-3 (epoxy equivalent: 195 to 205 g/eq), and YDCN-700-5 (epoxy equivalent: 196 to 206 g/eq) manufactured by Nippon Steel & Sumikin Chemical Co., Ltd., EOCN-1025 (epoxy equivalent: 205 to 217 g/eq) manufactured by Nippon Kayaku Co., Ltd., and the like.

The content of the novolac-type epoxy resin of the component (E) is preferably 1 to 30% by mass, and more preferably 10 to 30% by mass, in the total amount of the composition for optical stereolithography. If the content of the novolac-type epoxy resin of the component (E) exceeds 30% by mass, the obtained composition for optical stereolithography is hardly dissolved in water, and the dispersibility into washing water also deteriorates in some cases. Incorporating the component (E) in combination with the component (A) makes it possible to further enhance mechanical properties such as tensile strength, elongation, bending strength, and bending modulus of the obtained stereolithographic object, and also enhance the heat resistance. The novolac-type epoxy resin of the component (E) can be uniformly dispersed in the water-soluble component (A) by only motor stirring without particularly using a surfactant.

The component (B) is a water-soluble radical polymerizable compound having a methacrylic group and/or an acrylic group. It is only necessary that the component (B) in an uncured state should be water soluble and thus can be washed down with water at normal temperature. For example, the solubility into water at normal temperature (25° C.) is 5 g/100 ml or more, preferably 40 g/100 ml or more, and more preferably 50 g/100 ml or more. The water-soluble radical polymerizable compound of the component (B) is preferably a liquid at normal temperature. Hereinafter, the methacrylic group or acrylic group will also be referred to as "(meth)acryloyl group," and a methacrylate or acrylate will also be referred to as "(meth)acrylate".

The water-soluble radical polymerizable compound having a methacrylic group and/or an acrylic group of the component (B) may have one, two, three, or more functional groups. The component (B) is preferably miscible with the water-soluble cationic polymerizable compound of the component (A). Specific examples of each include the following compounds.

The monofunctional compound includes (meth)acryloylmorpholine, 2-hydroxyethyl (meth)acrylate, 2-hydroxypropyl (meth)acrylate, polyethylene glycol mono(meth)acrylate, polyethylene glycol mono(meth)acrylate, glycerol (meth)acrylate, nonylphenol EO-modified (meth)acrylate, a reaction product between 2-hydroxyethyl (meth)acrylate and phosphoric anhydride, a reaction product between a hexalide addition polymer of 2-hydroxyethyl (meth)acrylate and phosphoric anhydride, and the like.

The bifunctional compound includes triethylene glycol di(meth)acrylate, tetraethylene glycol di(meth)acrylate, polyethylene glycol (400) di(meth)acrylate, polyethylene glycol (600) di(meth)acrylate, polypropylene glycol (400) di(meth)acrylate, ethoxylated (4) bisphenol A di(meth)acrylate, ethoxylated (10) bisphenol A di(meth)acrylate, ethoxylated (30) bisphenol A di(meth)acrylate, ethoxylated (4) hydrogenated bisphenol A di(meth)acrylate, ethoxylated (30) hydrogenated bisphenol A di(meth)acrylate, EO-modified (10) hydrogenated bisphenol A di(meth)acrylate, and the like.

The compound having three or more functional groups includes ethoxylated (9) glycerol tri(meth)acrylate, ethoxylated (20) glycerol tri(meth)acrylate, polyether-based urethane trifunctional (meth)acrylate, and the like.

The water-soluble radical polymerizable compound having a methacrylic group and/or an acrylic group of the component (B) can be synthesized by known methods. Besides, commercially available products can be used. Examples thereof include Aronix series manufactured by Toagosei Co., Ltd., BLEMMER series manufactured by NOF Corporation, Light Ester series, Light Acrylate series, Epoxy Ester series, and Urethane Acrylate series manufactured by Kyoeisha Chemical Co., Ltd., NK Ester series and NK Oligo series manufactured by Shin Nakamura Chemical Co., Ltd., KAYARAD series manufactured by Nippon Kayaku Co., Ltd., Viscoat series manufactured by Osaka Organic Chemical Industry Ltd., and the like.

The content of the water-soluble radical polymerizable compound of the component (B) is 1 to 30% by mass, preferably 5 to 20% by mass, in the total amount of the composition for optical stereolithography. Incorporating the water-soluble radical polymerizable compound of the component (B) makes it possible to enhance the miscibility of the composition for optical stereolithography with water. Meanwhile, if the content of the radical polymerizable compound of the component (B) is less than 1% by mass, the sensitivity is insufficient. If the content exceeds 30% by mass, the cured product is not tough.

The content of the radical polymerizable compound of the component (B) is preferably lower than the content of the cationic polymerizable compound of the component (A). Setting the content of the radical polymerizable compound of the component (B) lower than the content of the cationic polymerizable compound of the component (A) makes it possible to enhance the hardness of the cured product.

In addition to the water soluble radical polymerizable compound of the component (B), the composition for optical stereolithography can further contain another water-insoluble or -poorly soluble radical polymerizable compound, without departing from the gist of the invention. The another radical polymerizable compound is incorporated in such an amount not to impair the water solubility of the resin composition for optical stereolithography. The amount is preferably, for example, 1 to 30% by mass in the total amount of the composition for optical stereolithography.

Specific examples of a monofunctional monomer of the another radical polymerizable compound include, for example, acrylamide, 7-amino-3,7-dimethyloctyl (meth)acrylate, isobutoxymethyl (meth)acrylamide, isobornyl (meth)acrylate, 2-ethylhexyl (meth)acrylate, diacetone (meth)acrylamide, dimethylaminoethyl (meth)acrylate, diethylaminoethyl (meth)acrylate, lauryl (meth)acrylate, dicyclopentenyloxyethyl (meth)acrylate, dicyclopentenyl (meth)acrylate, N,N-dimethyl (meth)acrylamide, tetrahydrofurfuryl (meth)acrylate, vinylcaprolactam, N-vinylpyrrolidone, phenoxyethyl (meth)acrylate, butoxyethyl (meth)acrylate, pentachlorophenyl (meth)acrylate, pentabromophenyl (meth)acrylate, polyethylene glycol mono(meth)acrylate, polypropylene glycol mono(meth)acrylate, isobornyl (meth)acrylate, and the like.

Specific examples of a bifunctional monomer of the another radical polymerizable compound include, for example, ethylene glycol di(meth)acrylate, tricyclodecanediyldimethylene di(meth)acrylate, tripropylene glycol di(meth)acrylate, neopentyl glycol di(meth)acrylate, bisphenol A diglycidyl ether with (meth)acrylic acid added to both ends, 1,4-butanediol di(meth)acrylate, 1,6-hexanediol di(meth)acrylate, polyester di(meth)acrylate, polyester-based urethane bifunctional (meth)acrylate, and the like.

Specific examples of a trifunctional or more multifunctional monomer of the another radical polymerizable compound include, for example, tris(acryloyloxyethyl)isocyanurate, trimethylolpropane tri(meth)acrylate, EO-modified trimethylolpropane tri(meth)acrylate, PO-modified trimethylolpropane tri(meth)acrylate, pentaerythritol tri(meth)acrylate, dipentaerythritol hexa(meth)acrylate, dipentaerythritol penta(meth)acrylate, ditrimethylolpropane tetra(meth)acrylate, dipentaerythritol monohydroxy penta(meth)acrylate, caprolactone-modified dipentaerythritol hexa(meth)acrylate, caprolactone-modified dipentaerythritol penta(meth)acrylate, polyether-based urethane trifunctional (meth)acrylate, ethoxylated isocyanuric acid tri(meth)acrylate, and the like.

The component (C) is an antimony-free cationic polymerization initiator which is a sulfonium compound or a bis(alkylphenyl)iodonium compound. The cationic polymerization initiator of the component (C) does not contain a deleterious substance antimony (Sb). Accordingly, the safety for human bodies and the environment is high. Moreover, it is possible to reduce the load of the waste liquid treatment in the process of producing a stereolithographic object.

Specific examples of the antimony-free cationic polymerization initiator of the component (C) include bis[4-n-alkyl (C10 to 13)phenyl]iodonium hexafluorophosphate, bis(4-tert-butylphenyl)iodonium bis(perfluorobutanesulfonyl) imide, bis(4-tert-butylphenyl)iodonium hexafluorophosphate, bis[4-n-alkyl(c10 to 13)phenyl]iodonium tetrakis pentafluorophenyl borate, diphenyl[4-(phenylthio)phenyl]sulfonium hexafluorophosphate, 4,4-bis(diphenylsulfonyl)phenyl sulfide-bis-hexafluorophosphate, and the like.

As the antimony-free cationic polymerization initiator of the component (C), commercially available products can be used. Examples thereof include San-Aid SI series manufactured by Sanshin Chemical Industry Co., Ltd., WPI series manufactured by Wako Pure Chemical Industries, Ltd., SP series manufactured by Adeka Corporation, CPI series manufactured by San-Apro Ltd., and the like.

The content of the antimony-free cationic polymerization initiator of the component (C) is within a range of 0.1 to 20% by mass, preferably within a range of 0.5 to 10% by mass, in the total amount of the composition for optical stereolithography. If the content is less than 0.1% by mass, the cationic polymerization reaction rate is slow. If the content exceeds 20% by mass, the composition for optical stereolithography has low curing properties.

The component (D) is a radical polymerization initiator. The radical polymerization initiator is not particularly limited, as long as the compound is capable of starting a radical reaction of the radical polymerizable compound by generating radical species when irradiated with an activation energy ray. Specific examples of the radical polymerization initiator include 2,2-dimethoxy-1,2-diphenylethan-1-one, 1-hydroxy-cyclohexyl-phenyl-ketone, 2-hydroxy-2-methyl-1-phenyl-propan-1-one, 1-[4-(2-hydroxyethoxy)-phenyl]-2-hydroxy-2-methyl-1-propan-1-one, 2-hydroxy-1-[4-[4-(2-hydroxy-2-methyl-propionyl)-benzyl]phenyl]-2-methyl-propan-1-one, phenylglyoxylic acid methyl ester, 2-methyl-1-(4-methylthiophenyl)-2-morpholinopropan-1-one, 2-benzyl-dimethylamino-1-(4-morpholinophenyl)-butane-1,2-(dimethylamino)-2-[(4-methylphenyl)methyl]-1-[4-(4-morpholinyl)phenyl]-1-butane, 2,4,6-trimethylbenzoyl-diphenyl-phosphine oxide, bis(2,4,6-trimethylbenzoyl)-phenylphosphine oxide, bis(η5-2,4-cyclopentadiene-1-yl)-bis(2,6-difluoro-3-(1H-pyrrol-1-yl)-phenyl)titanium, 1,2-octanedione-1-[4-(phenylthio)-2-(O-benzoyloxime)], ethanone,1-[9-ethyl-6-(2-methylbenzoyl)-9H-carbazol-3-yl]-1-(O-acetyloxime), camphorquinone, benzophenone, 2-hydroxy-2-methyl-1-phenyl-1-propane, 4,4-bis(diethylamino)benzophenone, ethyl-4-(dimethylamino)-benzoate, [4-(methylphenylthio)phenyl]-phenylmethane, ethylhexyl-4-dimethylaminobenzoate, methyl o-benzoylbenzoate, 4-methylbenzophenone, camphorquinone, tetrabutylammonium butyltriphenylborate, tetrabutylammonium butyltrinaphthylborate, 2-ethyl-4-methylimidazolium tetraphenylborate, 1,5-diazabicyclo[4.3.0]nonene-5-tetraphenylborate, and the like. One of the radical polymerization initiators can be used alone, or two or more thereof can be used in combination.

As the radical polymerization initiator of the component (D), commercially available products can be used. Examples thereof include IRGACURE series, DAROCUR series, and LUCIRIN series manufactured by BASF SE, SB-PI series of SORT Co., Ltd., Adeka Optomer series manufactured by Adeka Corporation, organoboron compound series manufactured by Showa Denko K.K., organoboron compound series manufactured by Hokko Chemical Industry Co., Ltd., and the like.

The content of the radical polymerization initiator of the component (D) is within a range of 0.1 to 20% by mass, preferably within a range of 0.5 to 10% by mass, in the total amount of the composition for optical stereolithography. If the content is less than 0.1% by mass, the radical polymerization reaction rate of the composition for optical stereolithography is slow. If the content exceeds 20% by mass, the composition for optical stereolithography has low curing properties.

The component (F) is a sensitizer. The sensitizer is not particularly limited, as long as the compound is capable of increasing the photosensitivity of the composition for optical stereolithography (the compound is conceivably capable of absorption at a wavelength of preferably 300 to 500 nm), but a multifunctional thiol compound is preferable. Specific examples of the multifunctional thiol compound include 1,3,5-tris(3-mercaptobutyryloxyethyl)-1,3,5-triazine-2,4,6 (1H,3H,5H)-trione, 1,4-bis(3-mercaptobutyryloxy)butane, pentaerythritol tetrakis(3-mercaptobutylate), trimethylolpropane tris(3-mercaptopropionate), tris[(3-mercaptopropionyloxy)-ethyl]-isocyanurate, pentaerythritol tetrakis(3-mercaptopropionate), and the like. Commercially available multifunctional thiol compound can be used as the sensitizer of the component (E). Examples thereof include QX40 manufactured by Mitsubishi Chemical Corporation, Adeka Hardener EH-317 manufactured by Adeka Corporation, PEMP, TBMPIC, and TMPMP manufactured by SC Organic Chemical Co., Ltd., KarenzMT series manufactured by Showa Denko K.K., and the like.

Specific examples of sensitizers other than the multifunctional thiol compound include benzophenone; acridines such as 9-phenylacridine, 9-(p-methylphenyl)acridine, 9-(o-methylphenyl)acridine, 9-(o-chlorophenyl)acridine, and 9-(o-fluorophenyl)acridine; coumarins such as 7,7-(diethylamino)(3,3-carbonylbiscoumarin), 3-benzoyl-7-diethylaminocoumarin, and 7,7-bis(methoxy)(3,3-carbonylbiscoumarin); anthracenes such as 9,10-dimethoxyanthracene, 9,10-ethoxyanthracene, and 9,10-butoxyanthracene; and the like.

The content of the sensitizer of the component (F) is preferably within a range of 0.05 to 5.0% by mass, more preferably within a range of 3 to 5% by mass, in the total amount of the composition for optical stereolithography. If the content exceeds 5.0% by mass, the sensitivity is locally decreased, or the curing occurs only on a part of the surface. Adding the component (F) to the composition for optical stereolithography further promotes the photo curing reaction, and all the polymerizable components in the composition are cured (linked). This makes it possible to obtain sufficient mechanical strength and heat resistance when a stereolithographic object is formed.

The composition for optical stereolithography can contain a solvent for dissolving or dispersing the component (C) and/or the component (D), a curing accelerator, a colorant, and the like as other components within such ranges that the properties of the composition for optical stereolithography are not adversely influenced. Those skilled in the art can adjust the contents of the other components as appropriate.

The composition for optical stereolithography contains: 10 to 70% by mass of the water-soluble cationic polymerizable compound which is an ether derivative of sorbitol having a glycidyl ether structure of the component (A); 1 to 30% by mass of the water-soluble radical polymerizable compound having a methacrylic group and/or an acrylic group of the component (B); 0.1 to 20% by mass of the antimony-free cationic polymerization initiator which is a sulfonium compound or a bis(alkylphenyl)iodonium compound of the component (C); and 0.1 to 20% by mass of the radical polymerization initiator of the component (D); also optionally contains 1 to 30% by mass of the novolac-type epoxy resin of the component (E) and 0.05 to 5.0% by mass of the sensitizer of the component (F); and may further contain another cationic polymerizable compound, another radical polymerizable compound, and/or other components. At least one of the water soluble cationic polymerizable compound of the component (A) and the water soluble radical polymerizable compound of the component (B) is a liquid component at normal temperature (25° C.), and solid components at normal temperature exist in a dispersed state in the liquid component within the composition for optical stereolithography. Moreover, a water-insoluble component is normally uniformly dispersed in the water-soluble components such as the components (A) and (B) by stirring with a stirrer.

The composition for optical stereolithography can be prepared according to conventional methods. For example, the optical stereolithographic composition can be prepared through steps of: stirring the components (A) to (D), optionally the components (E) and (F), and further another cationic polymerizable compound, another radical polymerizable compound, and/or other components, as necessary, to form a uniform mixture; filtering the mixture to remove foreign matters mixed in the raw materials and foreign matters mixed in the production process; and deaerating the mixture. The amounts of the components blended are set such that the final concentrations in the composition for optical stereolithography fall within the above-described ranges. In a case where the components such as the components (B), (C), and (D) are solid at normal temperature, the components are preferably dissolved or dispersed in a solvent in advance for use. The stirring is preferably performed at a temperature of 20 to 40° C. for 1 to 2 hours. This is because: if the temperature is less than 20° C., the viscosities of the polymerizable compounds are increased, and the stirring efficiency is decreased in some cases; and if the temperature exceeds 40° C., the viscosities are decreased and the stirring efficiency is improved, but the qualities of the photoinitiator and the polymerizable compounds are decreased in some cases. The composition for optical stereolithography prepared as described above is liquid at normal temperature (25° C.). From the viewpoint of stereolithography, the composition for optical stereolithography preferably has a viscosity of approximately 200 to 1500 mPa·s at normal temperature.

The composition for optical stereolithography exhibits such properties as being water soluble. Herein, the term "water soluble" regarding the composition for optical stereolithography means that the composition can be uniformly dispersed or mixed in water or an aqueous medium containing water at a certain percentage, for example, at normal temperature (25° C.), or that the composition can be dissolved with a solubility of 0.4 ml/ml or more. For example, at normal temperature (25° C.), an uncured part of the composition for optical stereolithography is washed down with water or an aqueous medium containing water at normal temperature and can be easily removed. Herein, the phrase "washed down with water or an aqueous medium containing water" is meant to include: in a case where the optical stereolithographic composition contains a water-insoluble component, the water-insoluble component is removed together with the water for washing and/or the water-soluble components, in a dispersed state in the water for washing and/or the water-soluble components; and, in a case where the composition for optical stereolithography has a high viscosity, and similar cases, for example, the composition is sprayed with the water or aqueous medium at a certain hydraulic pressure, followed by a washing operating such as brushing to remove a part of the composition for optical stereolithography as a mass, together with the water or aqueous medium, and remove the remaining part of the optical stereolithographic composition in a dispersed or dissolved state in the water or aqueous medium. Thus, water can be used for washing a stereolithography apparatus used for the optical stereolithography and removing an uncured composition for optical stereolithography attached to the stereolithographic object, so that it is not necessary to use organic solvents such as acetone and isopropyl alcohol. This increases the work stability in the process of producing a stereolithographic object and achieves a reduction in the environmental burden. Further, it is possible to reduce the load of the washing waste water treatment.

Cured layers formed of the composition for optical stereolithography according to the present invention adhere to one another with an excellent adhesiveness. Hence, when the composition for optical stereolithography according to the present invention is cured using a stereolithography apparatus, the cured layers will not warp and get caught in the ultraviolet-laser operating machine and the like, so that the stereolithographic object can be produced smoothly. Further, the composition for optical stereolithography makes it possible to produce a stereolithographic object with a small warp deformation and a high dimensional precision. In addition, the stereolithographic object formed by curing the composition for optical stereolithography also has excellent mechanical properties, for example, tensile strength, elongation, bending strength, and bending modulus, in addition to the high dimensional precision.

The composition for optical stereolithography according to the present invention is suitably usable for optical stereolithography and applicable in a wide range of fields. Specific examples of the usage are not particularly limited, and include high-precision parts, electrical and electronic parts, architectures, components for automobiles, dies, matrixes, medical holding devices such as orthopedic casts, mouthguards for stabilizing teeth, plastic objects created for dental care, medical plastic equipment, automobile parts, and the like.

A stereolithographic object can be produced from the composition for optical stereolithography according to the present invention by employing conventional optical stereolithographic methods and stereolithography apparatuses. The method for producing a stereolithographic object includes, for example, the steps of: (a) forming a cured layer by selectively irradiating the surface of the above-described composition for optical stereolithography with an activation energy ray based on contour data created from data on a shape which is inputted by three-dimensional CAD and sliced into multiple layers of thin cross-sectional pieces; (b) further supplying the composition for optical stereolithography onto the cured layer; (c) performing a stacking operation of forming a new cured layer continuously on the above-described cured layer by selective irradiation with an activation energy ray as in step (a); and (d) repeating this stacking operation. These steps make it possible to provide an intended stereolithographic object. The thickness of the single or stacked cured layers can be set, for example, 20 to 200 μm. The smaller the thickness of the cured layer(s), the higher the stereolithographic precision. Nevertheless, the time and cost necessary for the production are increased. Hence, in consideration of the balance of these, the thickness can be adjusted as appropriate.

The stereolithography apparatus used for the production of a stereolithographic object from the composition for optical stereolithography is not particularly limited. Examples thereof include three-dimensional additive stereolithography apparatuses such as ATOMm-4000 (manufactured by CMET Inc.), DigitalWaX(registered trademark) 020X (manufactured by Sea Force Co., Ltd.), and ACCULAS(registered trademark) BA-85S (manufactured by D-MEC Ltd.).

Examples of the activation energy ray with which the composition for optical stereolithography is irradiated include ultraviolet, visible light, ionizing radiation, X-rays, electron beams, and the like. Preferable is ultraviolet or visible light. The wavelength of the ultraviolet or visible light is preferably 300 to 500 nm. A light source of the ultraviolet or visible light includes diode-pumped solid-state lasers, carbon arc lamps, mercury lamps, metal halide lamps, xenon lamps, chemical lamps, white LEDs, and the like, but is not limited thereto. Particularly, from the viewpoints of stereolithographic precision, curability, and so forth, a laser is preferably used.

After the stacking operation is completed, to remove an uncured composition for optical stereolithography attached to the obtained stereolithographic object and the stereolithography apparatus, the stereolithographic object and the stereolithography apparatus are preferably washed. For the washing, water or a mixture of water with a surfactant, an antimicrobial agent, a preservative, and/or alcohol, or the like can be used. After the washing, post curing can be performed as necessary by heating or irradiation with an activation energy ray such as ultraviolet or visible light.

The stereolithographic object according to the present invention is a stereolithographic object containing the above-described cured products of the composition for optical stereolithography, and is preferably a stereolithographic object prepared by stacking the cured layers formed by curing the composition for optical stereolithography. The stereolithographic object is produced, for example, by the above-described method for producing a stereolithographic object. Since the cured layers adhere to one another in the stereolithographic object according to the present invention, the created object has a small warp deformation and an enhanced dimensional precision in the production process. Further, the stereolithographic object is excellent in heat resistance and mechanical properties such as tensile strength, elongation, bending strength, and bending modulus.

EXAMPLES

1. Evaluation of Compositions for Optical Stereolithography Containing Components (A) to (D)
[Preparation of Compositions for Optical Stereolithography]

Compositions for optical stereolithography of Examples 1 to 7 and Comparative Examples 1 to 5 were prepared according to the following procedure.

According to each formula shown in Table 1, all the components were put into a stirring container and stirred at a temperature of 20 to 40° C. for 2 hours. Thereby, a liquid composition was obtained. This liquid composition was filtered through a 10-micron filter bag (PO-10-PO3A-503, manufactured by Xinxiang D. King industry) to remove foreign matters. The resultant was left standing overnight and then deaerated. Thus, a transparent liquid composition was obtained.

Several ml of each of the prepared compositions for optical stereolithography of Examples 1 to 7 and Comparative Examples 1 to 5 was placed on a stage and watered. As a result, all of the compositions were easily washed down with the water successfully.

TABLE 1

| | Components | | | | | | | | | | | |
|---|---|---|---|---|---|---|---|---|---|---|---|---|
| | Water soluble cationic polymerizable compound | | | Water soluble radical polymerizable compound | | | Another cationic polymerizable compound | | Cationic polymerization initiator | | Radical polymerization initiator | |
| | Denacol | | | | Fancryl | New | | | | | | |
| | Denacol EX-612 | EX-614B | Denacol EX-611 | NK Oligo UA-7100 | FA-240M | Frontier BPE-20 | Rikaresin BEO-60E | Eternacoll OXMA | San-Aid SI-180L | WPI-124 | IRGACURE 907 | IRGACURE 651 | Total |
| Example 1 | 40 | | | 20 | | | 10 | | 3 | | 2 | | 75 |
| Example 2 | 40 | | | 20 | | | | 10 | 3 | | 2 | | 75 |
| Example 3 | 40 | | | | 20 | | 10 | | | 3 | | 2 | 75 |
| Example 4 | | 40 | | | 20 | | 10 | | 3 | | | 2 | 75 |
| Example 5 | | | 40 | | | 20 | 10 | | | 3 | 2 | | 75 |
| Example 6 | | 11 | | 9 | | | 50 | | 3 | | 2 | | 75 |
| Example 7 | | 50 | | | 20 | | | | 3 | | 2 | | 75 |
| Comparative Example 1 | | | | 30 | | | 30 | 10 | 3 | | 2 | | 75 |

TABLE 1-continued

| | Water soluble cationic polymerizable compound | | | Water soluble radical polymerizable compound | | | Another cationic polymerizable compound | | Cationic polymerization initiator | | Radical polymerization initiator | | |
|---|---|---|---|---|---|---|---|---|---|---|---|---|---|
| | Denacol EX-612 | Denacol EX-614B | Denacol EX-611 | NK Oligo UA-7100 | Fancryl FA-240M | New Frontier BPE-20 | Rikaresin BEO-60E | Eternacoll OXMA | San-Aid SI-180L | WPI-124 | IRGACURE 907 | IRGACURE 651 | Total |
| Comparative Example 2 | | | | 30 | 40 | | | | 3 | 2 | | | 75 |
| Comparative Example 3 | | | | 20 | 30 | | | | | | 5 | | 55 |
| Comparative Example 4 | 50 | | | | | | 40 | | 5 | | | | 95 |
| Comparative Example 5 | 50 | | | | | | 30 | 10 | 5 | | | | 95 |

(Each numerical value of the compositions is expressed in parts by mass)
Denacol EX-612: sorbitol polyglycidyl ether (epoxy equivalent: 166) (manufactured by Nagase ChemteX Corporation),
Denacol EX-614B: sorbitol polyglycidyl ether (epoxy equivalent: 173) (manufactured by Nagase ChemteX Corporation)),
Denacol EX-611: sorbitol polyglycidyl ether (epoxy equivalent: 195) (manufactured by Emerald Performance Materials),
NK Oligo UA-7100: urethane acrylate (manufactured by Shin Nakamura Chemical Co., Ltd.),
Fancryl FA-240M: polyethylene glycol #400 dimethacrylate (manufactured by Hitachi Chemical Company, Ltd.),
New Frontier BPE-20: EO-modified bisphenol A diacrylate (manufactured by DKS Co. Ltd.),
Rikaresin BEO-60E: bisphenol A bis(triethylene glycol glycidyl ether)ether (n + m = 6) (manufactured by New Japan Chemical Co., Ltd.),
ETERNACOLL OXMA: 1,4-benzenedicarboxylic acid, bis[(3-ethyl-3-oxetanyl)methyl]ester (manufactured by Ube Industries, Ltd.),
San-Aid SI-180L: PF6 based sulfonium salt (manufactured by Sanshin Chemical Industry Co., Ltd.),
WPI-124: bis[4-(alkylC10 to C13)phenyl]iodonium tetrakis pentafluorophenyl borate (manufactured by Wako Pure Chemical Industries, Ltd.),
IRGACURE 907: 2-methyl-1-(4-methylthiophenyl)-2-morpholinopropan-one (manufactured by BASF SE),
IRGACURE 651: 2,2-dimethoxy-1,2-diphenylethan-1-one (manufactured by BASF SE).

[Fabrication of Evaluation Samples]

The compositions for optical stereolithography of Examples 1 to 7 and Comparative Examples 1 to 5 were each poured into a hand-made, rectangular polyethylene mold (a width of approximately 10 mm×a length of 100 mm with a depth of 5 mm) to form a 1-mm liquid film, and irradiated using a 3-kw high-pressure mercury lamp (wavelength: 365 nm, distance: 1 m) for 20 seconds, which were repeated four times in total. Thus, a flat plate (a width of approximately 10 mm×a length of 100 mm) having a thickness of approximately 4 mm was fabricated. Further, the flat plate was irradiated again for 30 minutes.

[Evaluation Method]

1) Layer (Side Surface) Observation of Optical Stereolithographic Objects

The layers (side surfaces) of the flat plates were measured using a JSM-5600 scanning electron microscope manufactured by JEOL Ltd. (acceleration voltage: 7 kv, magnification: 200×). The evaluation criteria were: if a gap was clearly seen between the layers, ("D"); if a gap between the layers was small, ("C"); if no gap but a line was seen between the layers, ("B"); and if the layers were seen to be integrated such that the layers were not confirmed, ("A").

2) Warp Deformation Observation of Optical Stereolithographic Objects

The flat plates were each placed on a flat stage, and a distance of an end portion of the flat plate separated from the flat stage was measured. The judgment criteria were: if the distance was 2 mm or more, ("D"); if the two were separated by the distance of 2 mm or less, ("C"); and if the two were not separated with the distance of 0 mm, ("B").

3) Tensile Test

In the tensile test of the flat plates, each tensile strength and elongation were measured according to ISO 527-1 under the following measurement conditions. The elongation was measured as the maximum elongation ratio at break.

Measurement apparatus: 3366 Type universal testing system manufactured by Instron Tensile speed (cross-head speed): 5 mm/min Measurement environment: a temperature of 25° C., a humidity of 45% RH Gauge length: 80 mm 4) Three-Point Bending Test In the three-point bending test of the flat plates, each bending strength and bending modulus were measured according to ISO 527-1 under the following measurement conditions.

Measurement apparatus: 3366 Type universal testing system manufactured by Instron Three-point bending test jig (indenter radius: 5 mm), distance between supports: 64 mm, Loading speed (cross-head speed): 2 mm/min, Load measurement environment: a temperature of 25° C., a humidity of 45% RH Table 2 shows the results of 1) to 4).

TABLE 2

| | Layer (side surface) observation | Warp deformation observation | Tensile strength (MPa) | Elongation (%) | Bending strength (MPa) | Bending modulus (MPa) |
|---|---|---|---|---|---|---|
| Example 1 | B | B | 39 | 10 | 46 | 1650 |
| Example 2 | A | B | 40 | 9 | 53 | 2100 |
| Example 3 | B | B | 38 | 10 | 50 | 1210 |
| Example 4 | B | B | 37 | 10 | 49 | 1800 |

TABLE 2-continued

|  | Layer (side surface) observation | Warp deformation observation | Tensile strength (MPa) | Elongation (%) | Bending strength (MPa) | Bending modulus (MPa) |
|---|---|---|---|---|---|---|
| Example 5 | B | B | 39 | 10 | 48 | 1700 |
| Example 6 | B | B | 35 | 10 | 45 | 1670 |
| Example 7 | B | B | 37 | 11 | 46 | 1590 |
| Comparative Example 1 | B | C | 25 | 3 | 20 | 70 |
| Comparative Example 2 | C | C | 10 | <2 | 8 | 48 |
| Comparative Example 3 | D | C | 6 | <2 | 10 | 44 |
| Comparative Example 4 | B | D | 20 | 3 | 46 | 450 |
| Comparative Example 5 | A | C | 27 | 6 | 48 | 550 |

As shown in Table 2, when the compositions for optical stereolithography of Examples 1 to 7 were used, the cured layers adhered to one another, no gap was observed between the layers, no warp deformation occurred, and straight flat shapes were retained. On the other hand, when the compositions for optical stereolithography of Comparative Examples 2 and 3 were used, the cured layers did not adhere to one another, and gaps were observed between the cured layers. When the compositions for optical stereolithography of Comparative Examples 1 to 5 were used, the stereolithographic objects had warp deformations. Further, the stereolithographic objects obtained by stacking the cured layers of the compositions for optical stereolithography of Examples 1 to 7 were superior in mechanical properties such as tensile strength, elongation, bending strength, and bending modulus to the stereolithographic objects obtained from the compositions for optical stereolithography of Comparative Examples 1 to 5. Thus, it was verified that the stereolithographic objects of Examples 1 to 7 were excellent in toughness and had such high durability properties that the objects tended not to be fractured even when an external stress such as bending was applied thereto.

Moreover, although the data are not illustrated, when cured layers each having a thickness of approximately 100 µm were stacked using the compositions for optical stereolithography of Examples 1 to 7 with a stereolithography apparatus also, the cured layers were stacked on one another without gaps, no warp deformation occurred, and stereolithographic objects having excellent mechanical properties were similarly obtained.

2. Evaluation of Compositions for Optical Stereolithography Containing Components (A) to (F)

[Preparation of Compositions for Optical Stereolithography]

Compositions for optical stereolithography of Examples 8 to 19 were prepared according to the following procedure.

According to each formula shown in Table 3, all components were put into a stirring container and stirred at a temperature of 20 to 40° C. for 2 hours. Thereby, a liquid composition was obtained. This liquid composition was filtered through a 10-micron filter bag (PO-10-PO3A-503, manufactured by Xinxiang D. King industry) to remove foreign matters. The resultant was left standing overnight and then deaerated. Thus, a transparent liquid composition was obtained.

Several ml of each of the prepared compositions for optical stereolithography of Examples 8 to 19 was placed on a stage and watered. As a result, all of the compositions were easily washed down with the water successfully.

TABLE 3

| Components | | | | | | | | | |
|---|---|---|---|---|---|---|---|---|---|
|  | A | A' | B | C | | D | E | | |
|  | Denacol EX-612 | Rikaresin BEO-60E | NK Oligo UA-7100 | San-Aid SI-180L | WPI-124 | IRGACURE 907 | EPICLON N-730A | JER 152 | YDPN-638 |
| Example 8 | 40 | 10 | 20 | 3 | | 2 | 10 | | |
| Example 9 | 40 | 10 | 20 | 3 | | 2 | | 10 | |
| Example 10 | 40 | 10 | 20 | 3 | | 2 | | | 10 |
| Example 11 | 40 | 10 | 20 | 3 | | 2 | 10 | | |
| Example 12 | 40 | 10 | 20 | | 3 | 2 | 10 | | |
| Example 13 | 40 | 10 | 20 | | 3 | 2 | | | 10 |
| Example 14 | 40 | 10 | 20 | 3 | | 2 | 10 | | |
| Example 15 | 40 | 10 | 20 | 3 | | 2 | | | |
| Example 16 | 40 | 10 | 20 | 3 | | 2 | 10 | | |
| Example 17 | 40 | 10 | 20 | 3 | | 2 | | | |
| Example 18 | 40 | 10 | 20 | 3 | | 2 | 2 | | |
| Example 19 | 40 | 10 | 20 | 3 | | 2 | 10 | | |

TABLE 3-continued

|  | Components | | | |
|---|---|---|---|---|
|  | F | | F' | |
|  | Adeka Hardener EH-317 | KarenzMTNR 1 | 3-benzoyl-7-diethylaminocoumarin | Total |
| Example 8 | 0.2 | | | 85.2 |
| Example 9 | | 0.2 | | 85.2 |
| Example 10 | | | 0.5 | 85.5 |
| Example 11 | 0.2 | | 0.3 | 85.5 |
| Example 12 | | 0.1 | | 85.1 |
| Example 13 | 0.5 | | | 85.5 |
| Example 14 | | 0.5 | | 85.5 |
| Example 15 | | | | 75.0 |
| Example 16 | | | | 85.0 |
| Example 17 | | 0.2 | | 75.2 |
| Example 18 | | | | 77.0 |
| Example 19 | 2 | | | 86.0 |

(Each numerical value of the compositions is expressed in parts by mass)
Component A: Water-soluble cationic polymerizable compound
Component A': Another cationic polymerizable compound
Component B: Water soluble radical polymerizable compound
Component C: Cationic polymerization initiator
Component D: Radical polymerization initiator
Component E: Novolac-type epoxy resin
Component F: Sensitizer (multifunctional thiol compound)
Component F': Sensitizer (other than multifunctional thiol compound)

Denacol EX-612: sorbitol polyglycidyl ether (epoxy equivalent: 166 g/eq) (manufactured by Nagase ChemteX Corporation),
Rikaresin BEO-60E: bisphenol A bis(triethylene glycol glycidyl ether)ether (n+m=6) (manufactured by New Japan Chemical Co., Ltd.),
NK Oligo UA-7100: urethane acrylate (manufactured by Shin Nakamura Chemical Co., Ltd.), San-Aid SI-180L: PF6 based sulfonium salt (manufactured by Sanshin Chemical Industry Co., Ltd.),
WPI-124: bis[4-(alkylC10 to C13)phenyl]iodonium tetrakis pentafluorophenyl borate (manufactured by Wako Pure Chemical Industries, Ltd.),
IRGACURE 907: 2-methyl-1-(4-methylthiophenyl)-2-morpholinopropan-one (manufactured by BASF SE),
EPICLON N-730A: novolac-type epoxy resin (epoxy equivalent: 175 g/eq) (manufactured by DIC Corporation),
JER 152: novolac-type epoxy resin (epoxy equivalent: 177 g/eq) (manufactured by Mitsubishi Chemical Corporation),
YDPN-638: novolac-type epoxy resin (epoxy equivalent: 180 g/eq) (manufactured by Nippon Steel & Sumikin Chemical Co., Ltd.),
Adeka Hardener EH-317: polymercaptan-based curing agent (manufactured by Adeka Corporation),
KarenzMTNR1: 1,3,5-tris(3-mercaptobutyryloxyethyl)-1,3,5-triazine-2,4,6(1H,3H,5H)-trione (manufactured by Showa Denko K.K.),
3-benzoyl-7-diethylaminocoumarin: (manufactured by Nikko Chem Tech Corporation).

[Fabrication of Evaluation Samples 1]

To evaluate the curing times of the compositions for optical stereolithography, the following samples were fabricated.

The composition for optical stereolithography of Example 8 was poured into a hand-made, rectangular polyethylene mold (a width of approximately 10 mm×a length of 100 mm with a depth of 5 mm) to form a 1-mm liquid film. Such liquid films were irradiated using a 3-kw high-pressure mercury lamp (wavelength: 365 nm, distance: 1 m) for 5 seconds, 10 seconds, 15 seconds, 20 seconds, 25 seconds, and 30 seconds, respectively. Thus, evaluation samples were obtained. The compositions for optical stereolithography of Examples 9 to 19 were also treated in the same manner, and evaluation samples thereof were obtained.

[Fabrication of Evaluation Samples 2]

For the evaluation as optical stereolithographic objects, the following samples were fabricated.

The composition for optical stereolithography of Example 8 was poured into a hand-made, rectangular polyethylene mold (a width of approximately 10 mm×a length of 100 mm with a depth of 5 mm) to form a 1-mm liquid film, and irradiated using a 3-kw high-pressure mercury lamp (wavelength: 365 nm, distance: 1 m) for 20 seconds, which were repeated four times in total. Thus, a flat plate (a width of approximately 10 mm×a length of 100 mm) having a thickness of approximately 4 mm was fabricated. Further, the flat plate was irradiated again for 30 minutes. Thus, an optical stereolithographic object was obtained. The compositions for optical stereolithography of Examples 9 to 19 were also treated in the same manner, and optical stereolithographic objects were obtained, respectively.

[Evaluation Method]

1) Evaluation of Curing Times of Compositions for Optical Stereolithography

Using the evaluation samples 1, the surface states were observed in the order of the samples having shorter irradiation times, the irradiation time at which the sample had no tuck on the surface was determined as the curing time. Note that, regarding the tuck on the surface, the evaluation samples 1 were placed in an oven, treated at 35° C. for 30 minutes, and cooled to room temperature (25° C.), and then the surfaces were pushed with a polyester film by hand. The presence or absence of a tuck was judged as follows: if the polyester film was not easily peeled, the sample had a tuck; if the polyester film was easily peeled, the sample had no tuck.

2) Layer (Side Surface) Observation of Optical Stereolithographic Objects

The layers (side surfaces) of the flat plates obtained by using the evaluation samples 2 were measured using a JSM-5600 scanning electron microscope manufactured by JEOL Ltd. (acceleration voltage: 7 kv, magnification: 200×). The evaluation criteria were: if a gap was clearly seen between the layers, ("D"); if a gap between the layers was small, ("C"); if no gap but a line was seen between the layers, ("B"); and if the layers were seen to be integrated such that the layers were not confirmed, ("A").

3) Warp Deformation Observation of Optical Stereolithographic Objects

The flat plates obtained by using the evaluation samples 2 were each placed on a flat stage, and a distance of an end portion of the flat plate separated from the flat stage was measured. The judgment criteria were: if the distance was 2 mm or more, ("D"); if the two were separated by the distance of 2 mm or less, ("C"); and if the two were not separated with the distance of 0 mm, ("B").

4) Tensile Test

In the tensile test of the flat plates obtained by using the evaluation samples 2, each tensile strength and elongation were measured according to ISO 527-1 under the following measurement conditions. The elongation was measured as the maximum elongation ratio at break.

Measurement apparatus: universal testing system manufactured by Instron
Tensile speed (cross-head speed): 5 mm/min
Measurement environment: a temperature of 25° C., a humidity of 45% RH
Gauge length: 80 mm 5) Three-Point Bending Test In the three-point bending test of the flat plates obtained by using the evaluation samples 2, each bending strength and bending modulus were measured according to ISO 527-1 under the following measurement conditions.

Measurement apparatus: 3366 Type universal testing system manufactured by Instron
Test conditions: three-point bending test jig, indenter radius: 5 mm,
distance between supports: 64 mm,
loading speed (cross-head speed) 2 mm/min Measurement environment: a temperature of 25° C., a humidity of 45% RH 6) Heat-Resistance Deformation Test (Deflection Temperature Under Load)

By the same methods for the evaluation samples 2, flat plates each having a width of 80 mm×a length of 10 mm and a thickness of 4 mm were fabricated (evaluation samples 3). The flat plates were tested for the deflection temperature under load according to ISO-75-1. A bending stress specified below was generated in the evaluation samples. In this state, the testing temperature was increased at a constant rate from room temperature (25° C.) to 300° C. (an oil bath was used) to measure a temperature at the time when the reference deflection reached (deflection temperature under load).

Measurement apparatus: No. 148-HD-PC Heat Distortion Tester
Rate of temperature rise: 120±10° C./hr
Bending stress: 1.80 Mpa

TABLE 4

| | Evaluation sample 1 Curing time (sec) | Evaluation sample 2 | | | | | | Evaluation sample 3 Deflection temperature under load (° C.) |
|---|---|---|---|---|---|---|---|---|
| | | Layer (side surface) observation | Warp deformation observation | Tensile strength (MPa) | Tensile elongation (%) | Bending strength (MPa) | Bending modulus (MPa) | |
| Example 8 | 10 | B | B | 55 | 13 | 60 | 1890 | 115.4 |
| Example 9 | 10 | B | B | 50 | 12 | 60 | 1920 | 117.2 |
| Example 10 | 10 | B | B | 66 | 5 | 71 | 1980 | 118.2 |
| Example 11 | 10 | B | B | 65 | 5 | 71 | 1960 | 119.0 |
| Example 12 | 15 | B | B | 50 | 12 | 66 | 1980 | 118.3 |
| Example 13 | 10 | B | B | 51 | 11 | 65 | 1990 | 118.6 |
| Example 14 | 10 | B | B | 52 | 11 | 66 | 1910 | 116.5 |
| Example 15 | 20 | B | B | 39 | 10 | 46 | 1650 | 49.9 |
| Example 16 | 20 | B | B | 38 | 10 | 45 | 1640 | 110.0 |
| Example 17 | 10 | B | B | 37 | 11 | 43 | 1649 | 51.1 |
| Example 18 | 25 | B | B | 38 | 13 | 45 | 1641 | 52.2 |
| Example 19 | 30 | B | B | 37 | 13 | 45 | 1639 | 105.9 |

Table 4 shows the evaluation results of 1) to 6) described above. The curing times of the compositions for optical stereolithography of Examples were 10 to 15 seconds. The compositions were highly sensitive and the curing rates were high. This indicates that the curing densities are high. Moreover, the stereolithographic objects obtained by stacking the cured layers of the compositions for optical stereolithography of Examples 8 to 14 had deflection temperatures under load of around 115 to 119° C., indicating that the heat resistance temperatures are high. Further, the stereolithographic objects obtained by stacking the cured layers of the compositions for optical stereolithography of Examples 8 to 14 were excellent also in mechanical properties such as tensile strength, elongation, bending strength, and bending modulus. Thus, it was verified that the stereolithographic objects of Examples 8 to 14 were excellent in heat resistance and had such high durability properties that the objects tended not to be fractured even when an external stress such as bending was applied thereto.

The invention claimed is:

1. A water-soluble composition for optical stereolithography, comprising:
   10 to 70% by mass of (A) a water-soluble cationic polymerizable compound which is an ether derivative of sorbitol having a glycidyl ether structure;
   1 to 30% by mass of (B) a water-soluble radical polymerizable compound having a methacrylic group and/or an acrylic group;
   0.1 to 20% by mass of (C) an antimony-free cationic polymerization initiator which is a sulfonium compound or a bis(alkylphenyl)iodonium compound; and
   0.1 to 20% by mass of (D) a radical polymerization initiator.

2. The composition for optical stereolithography according to claim 1, further comprising:
   1 to 30% by mass of (E) a novolac-type epoxy resin which is a cationic polymerizable compound; and
   0.05 to 5.0% by mass of (F) a sensitizer.

3. The composition for optical stereolithography according to claim 2, wherein the novolac-type epoxy resin has an epoxy equivalent within a range of 170 to 190 g/eq.

4. The composition for optical stereolithography according to claim 2, wherein the sensitizer is a multifunctional thiol compound.

5. The composition for optical stereolithography according to claim 1, wherein the ether derivative of sorbitol has an epoxy equivalent within a range of 155 to 200 g/eq.

6. The composition for optical stereolithography according to claim 1, wherein the glycidyl ether structure is an ether structure obtained by substituting a glycidyl group for at least one of six hydroxy groups of the sorbitol.

7. The composition for optical stereolithography according to claim 1, wherein the glycidyl ether structure is an ether structure obtained by substituting a glycidyl polyoxyethylene group for at least one of six hydroxy groups of the sorbitol.

8. The composition for optical stereolithography according to claim 1, further comprising 1 to 20% by mass of a cationic polymerizable compound having an epoxy group, a vinyl ether group, or an oxetane group, which is other than the ether derivative of sorbitol having a glycidyl ether structure.

9. A method for producing a stereolithographic object, comprising at least a step of curing the composition for optical stereolithography according to claim 1 by irradiation with an activation energy ray.

10. A stereolithographic object comprising a cured product of the composition for optical stereolithography according to claim 1.

* * * * *